United States Patent
Jawany et al.

(10) Patent No.: US 10,014,716 B2
(45) Date of Patent: Jul. 3, 2018

(54) DISCRETE ENERGY RESERVOIR WITH DIAGNOSTICS

(71) Applicant: Robert Bosch GmbH, Stuttgart (DE)

(72) Inventors: Jalal Jawany, Canton, MI (US); Stephen P. Sydor, West Bloomfield, MI (US)

(73) Assignee: Robert Bosch GmbH, Stuttgart (DE)

( * ) Notice: Subject to any disclaimer, the term of this patent is extended or adjusted under 35 U.S.C. 154(b) by 246 days.

(21) Appl. No.: 14/978,768

(22) Filed: Dec. 22, 2015

(65) Prior Publication Data

US 2017/0179760 A1 Jun. 22, 2017

(51) Int. Cl.
| | |
|---|---|
| H02J 9/06 | (2006.01) |
| B60L 1/00 | (2006.01) |
| H02J 7/00 | (2006.01) |
| B60R 16/03 | (2006.01) |
| G01R 31/36 | (2006.01) |
| G01R 31/00 | (2006.01) |
| G01R 31/01 | (2006.01) |

(52) U.S. Cl.
CPC .............. H02J 9/061 (2013.01); B60L 1/20 (2013.01); B60R 16/03 (2013.01); H02J 7/0029 (2013.01); H02J 7/0068 (2013.01); G01R 31/007 (2013.01); G01R 31/016 (2013.01); G01R 31/3679 (2013.01)

(58) Field of Classification Search
CPC combination set(s) only.
See application file for complete search history.

(56) References Cited

U.S. PATENT DOCUMENTS

| | | |
|---|---|---|
| 5,420,790 A | 5/1995 | Ravas, Jr. et al. |
| 5,703,412 A | 12/1997 | Takemoto et al. |
| 5,995,891 A | 11/1999 | Mayumi et al. |

(Continued)

FOREIGN PATENT DOCUMENTS

| | | |
|---|---|---|
| DE | 102014222681 A1 | 5/2015 |
| EP | 2699453 A1 | 2/2014 |
| JP | 2005354789 A | 12/2005 |

OTHER PUBLICATIONS

International Search Report and Written Opinion for Application No. PCT/EP2016/075100 dated Feb. 16, 2017 (14 pages).

*Primary Examiner* — An Luu
(74) *Attorney, Agent, or Firm* — Michael Best & Friedrich LLP (57) ABSTRACT

A backup power system in a vehicle that provides temporary power to one or more electronic control units (ECUs) upon failure of a main power supply. The backup power system includes an energy reservoir that stores electric charge. A charging circuit is electrically connected to the energy reservoir to generate charge for the energy reservoir during normal operation of the vehicle. A discharging circuit for supplying backup power is electrically connected between the energy reservoir and the ECUs. A diagnostic circuit is electrically connected to the energy reservoir and a microcontroller. The microcontroller is configured to monitor a slew rate of the energy reservoir as an amount of stored electric charge in the energy reservoir changes, determine if the slew rate is within a predetermined range, and when the slew rate is not within the predetermined range, generate a first error signal.

20 Claims, 8 Drawing Sheets

(56) References Cited

U.S. PATENT DOCUMENTS

| | | | |
|---|---|---|---|
| 6,169,669 B1 * | 1/2001 | Choudhury | H02J 9/062 307/66 |
| 6,448,784 B1 | 9/2002 | Belau et al. | |
| 6,697,955 B1 | 2/2004 | Malik et al. | |
| 6,731,023 B2 | 5/2004 | Rothleitner et al. | |
| 7,352,080 B2 | 4/2008 | Gasshoff | |
| 7,890,232 B2 | 2/2011 | Komaki et al. | |
| 7,932,622 B2 * | 4/2011 | Chiozzi | H03K 17/04106 307/10.1 |
| 7,944,182 B2 * | 5/2011 | Beg | H02J 9/062 307/64 |
| 8,362,784 B2 | 1/2013 | Takeuchi | |
| 2014/0285210 A1 | 9/2014 | Kanzaki et al. | |

* cited by examiner

DISCRETE ENERGY RESERVOIR WITH DIAGNOSTICS

BACKGROUND

Embodiments of the invention relate to backup power systems in a vehicle. Backup power systems may provide temporary power to operate electronic control units (ECUs) or similar control computers or processors of the vehicle upon failure of a main power supply. When the main power supply of the vehicle fails, critical functionality of the ECUs may cease unexpectedly. Backup power systems provide power for a limited time so that functionality may continue for a brief period of time. As a consequence, the ECUs may perform safe shutdowns and communicate critical vehicle messages to other vehicle systems before losing power. However, backup power systems may fail to operate when needed.

SUMMARY

A failure in a backup power system may arise due to a loss in energy storage capacity of energy storage devices, such as capacitors. It would beneficial to have a backup power system with diagnostics to facilitate the discovery of failures.

In one embodiment, the invention provides a backup power system in a vehicle that provides temporary power to at least one electronic control unit (ECU) upon failure of a main power supply. The backup power system includes an energy reservoir that stores electric charge. A charging circuit is electrically connected to the energy reservoir. A discharging circuit is electrically connected between the energy reservoir and the at least one electronic control unit. A diagnostic circuit is electrically connected to the energy reservoir and an electronic processor. The electronic processor is communicatively coupled to the diagnostic circuit and configured to monitor a slew rate of the energy reservoir as an amount of stored electric charge in the energy reservoir changes, determine if the slew rate is within a predetermined range, and when the slew rate is not within the predetermined range, generate a first error signal.

In another embodiment the invention provides a method of supplying temporary backup power to at least one electronic control unit (ECU) in a vehicle upon failure of a main power supply. The method includes charging the energy reservoir via a charging circuit and storing an electric charge in the energy reservoir. Upon failure of the main power supply, at least part of the electric charge in the energy reservoir is discharged to the at least one electronic control unit. A slew rate of the energy reservoir is monitored with an electronic processor during a change of the stored electric charge in the energy reservoir. The electronic processor determines if the slew rate is within a predetermined range. When the slew rate is not within the predetermined range, the electronic processor generates a first error signal.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

In modern vehicles, electronic control units (ECU) and similar devices send and receive messages via a vehicle communication bus. For example, messages may be sent between ECUs in the vehicle to exchange data and provide coordination among various components of the vehicle. Messages may be sent to various displays and gauges including those in an instrument panel for viewing by an operator or driver of the vehicle. The messages may be sent and received by multiple ECUs depending on the function of the message. In some cases, the messages may provide communications to synchronize automotive functions and messages to the driver. In one example, an airbag ECU transmits airbag status to other control systems and may send an alarm message to the instrument panel when the ECU detects an error in operation. In another example, an ECU may contain a gateway that manages encryption and decryption with communication systems external to the vehicle. The ECUs may only function when power is available from the main power system (e.g., a battery) of the vehicle. However, the main power system may fail and prevent communication among the ECUs and other vehicle systems including, for example, the display. It is therefore advantageous to provide a backup power system to allow the ECU to send critical system messages to other vehicle systems.

Figure 1:
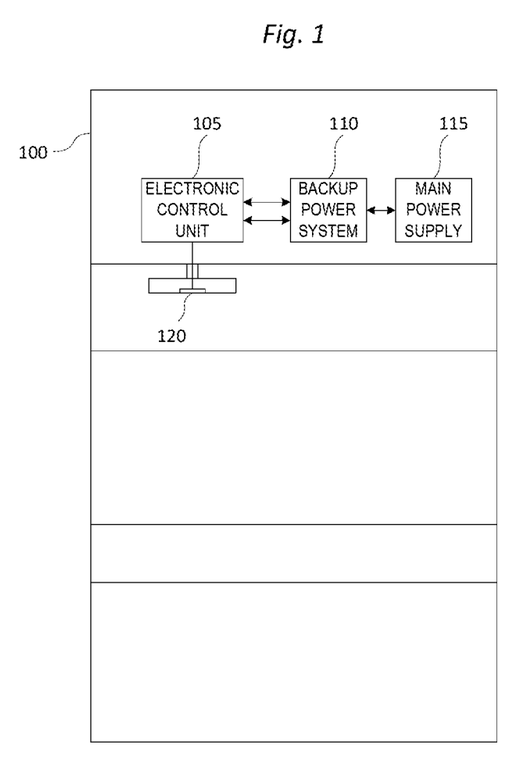
FIG. 1 is a block diagram of a vehicle including a backup power system for an electronic control unit.

FIG. 1 illustrates a vehicle 100 including an electronic control unit (ECU) 105, a backup power system 110, and a main power supply 115 (e.g., a vehicle battery). The ECU 105 is a controller for a vehicle system 120, such as, for example, an airbag. In such an example, the ECU 105 includes an airbag ECU that handles activation, monitoring, and communications of the airbag system. The ECU includes electronic processing circuitry, such as, an electronic processor, a memory, and an input/output interface that are configured to perform various logic processing for the vehicle 100. In normal operation of the vehicle 100, the ECU 105 receives electric power from the main power supply 115. However, when the main power supply 115 fails to deliver power to the ECU 105, the backup power system 110 provides temporary power to enable the ECU 105 to send messages to other vehicle systems. As a consequence, the ECU 105 may continue to operate and send messages to other systems of the vehicle 100 regarding, among other things, the status of the ECU 105. In the example above, the ECU 105 sends airbag status and/or airbag crash status to vehicle telematics and other ECUs within the vehicle 100.

Figure 2:
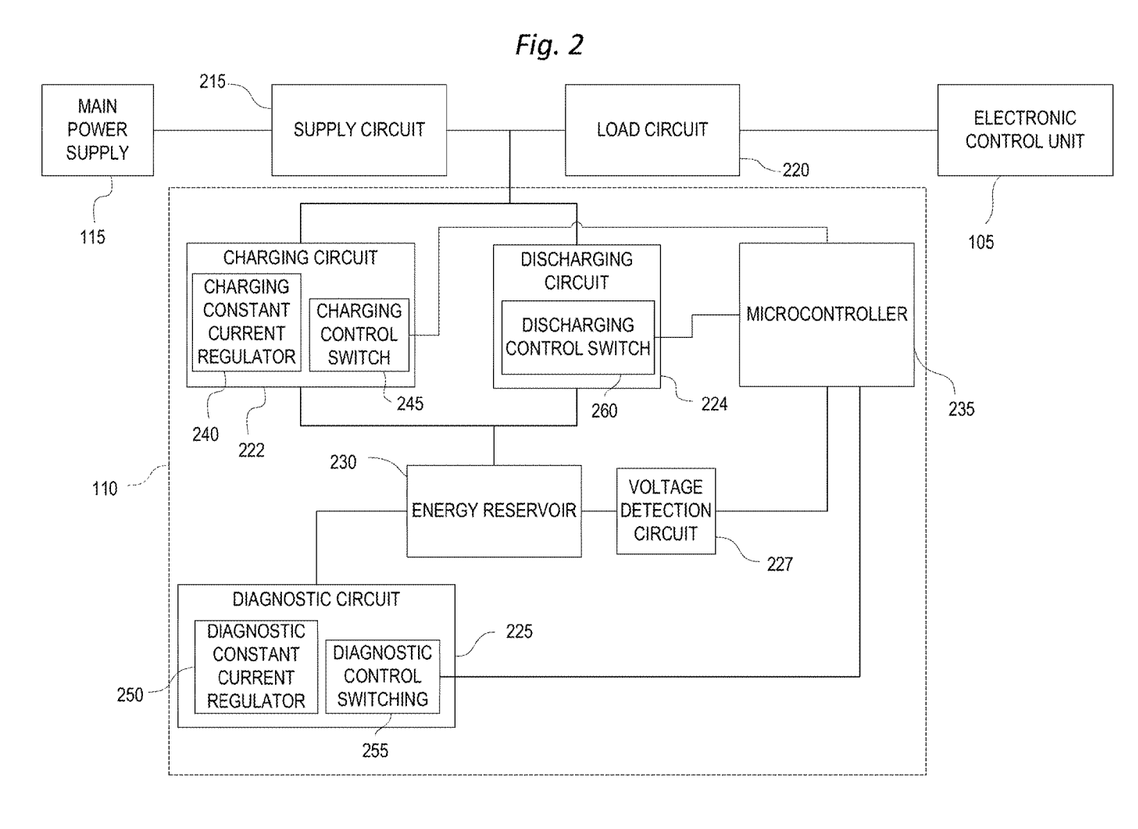
FIG. 2 is a block diagram of the backup power system of FIG. 1 according to one embodiment.

FIG. 2 is a block diagram of the backup power system 110 with some internal and external electrical connections illustrated according to one embodiment. In the example illustrated, the backup power system 110 includes a supply circuit 215, a load circuit 220, a charging circuit 222, a discharging circuit 224, a diagnostic circuit 225, a voltage detection circuit 227, an energy reservoir 230, and a microcontroller 235. The supply circuit 215 is electrically connected to the energy reservoir 230 and provides electric power from the main power supply 115 to the energy reservoir 230. The energy reservoir 230 may include one or more capacitors that provide electric charge to the ECU 105 via the load circuit 220. The microcontroller 235 is communicatively coupled to the charging circuit 222, the discharging circuit 224, and the diagnostic circuit 225. The microcontroller 235 is also electrically coupled to the energy reservoir 230 via the voltage detection circuit 227. The microcontroller 235 may also be directly electrically connected to a terminal of the energy reservoir 230.

In the example illustrated, the backup power system 110 includes both the charging circuit 222 and the discharging circuit 224. The charging circuit 222 includes a charging constant current regulator 240 and charging control switch 245, which includes a bypass for the charging constant current regulator 240. The charging circuit 222 is configured to receive control signals from the microcontroller 235 to control charging of the energy reservoir 230. In particular, the charging control switch 245 starts and stops charging of the energy reservoir 230 based on actuation by the microcontroller 235. The charging circuit 222 is also configured to perform charging diagnostics, which are described below. The discharging circuit 224 includes a discharging control switch 260, which when closed, electrically connects the energy reservoir 230 to the load circuit 220. The discharging circuit 224 and the discharging control switch 260 are actuated by the microcontroller 235 to control discharge of the energy reservoir 230 to the load circuit 220 on occurrence of a loss of power to the ECU 105. As a consequence, the discharging circuit 224 and the load circuit 220 provide the ECU 105 with electric power from the energy reservoir 230 when the backup power system is activated.

The backup power system 110 also includes various circuits that operate to perform diagnostics while not charging or discharging. In the example illustrated, the diagnostic circuit 225 includes a diagnostic constant current regulator 250 and diagnostic control switching 255. The microcontroller 235 operates the diagnostic control switching 255 to activate and deactivate the diagnostic circuit 225 during regular operation of the backup power system 110.

The voltage detection circuit 227 is a voltage detector that generates a voltage signal indicative of the voltage of the energy reservoir 230. The voltage signal may be provided by a direct electrical connection between the microcontroller 235 and a terminal of the energy reservoir 230. The voltage detection circuit 227 may also include a high-resistance voltage divider circuit electrically connected between the energy reservoir 230, the microcontroller 235, and ground. In such a case, the voltage divider circuit includes two resistances and an electrical connection between the two resistances electrically connected to the microcontroller 235. As a consequence, the microcontroller 235 detects voltages and discharge currents from the energy reservoir 230 through known resistances in the voltage divider to ground.

Figure 3:
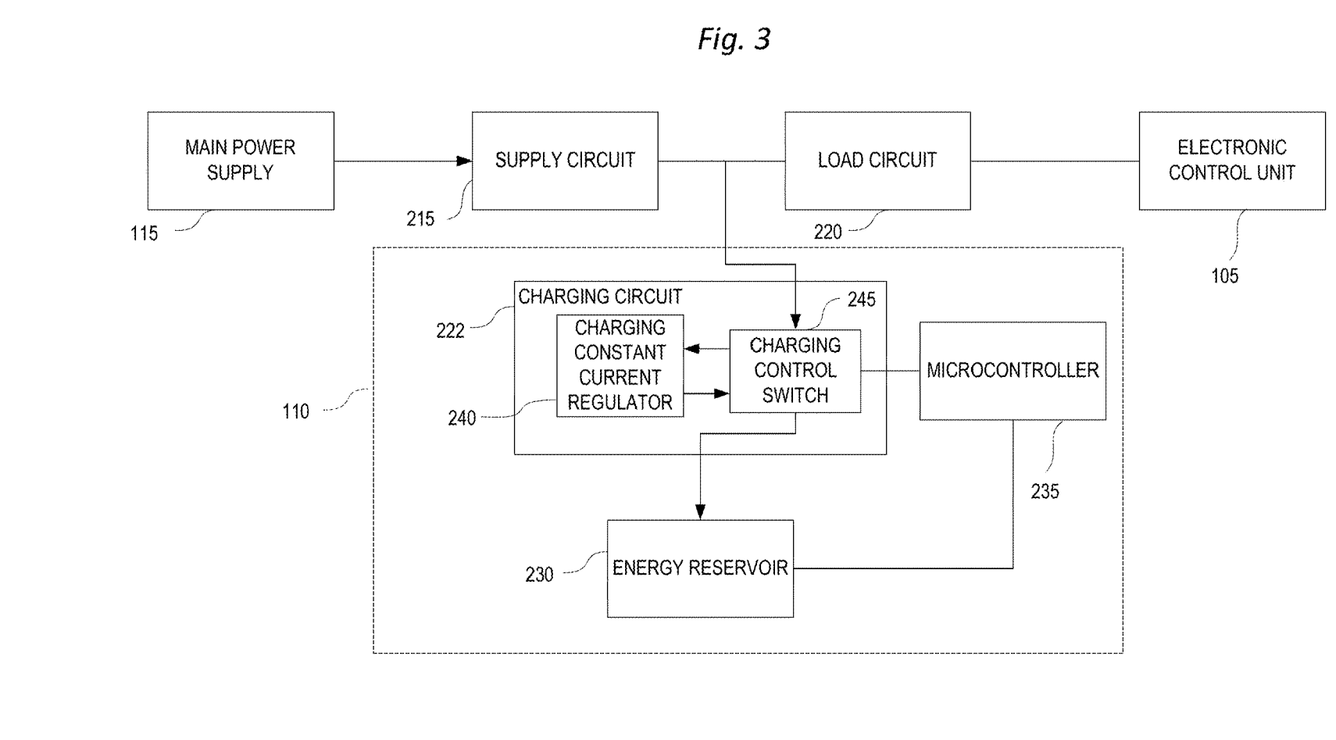
FIG. 3 is a block diagram illustrating charging of the backup power system of FIG. 2 according to one embodiment.

FIG. 3 illustrates a current path for the backup power system 110 of FIG. 2 during charging of the energy reservoir 230. On start-up of the vehicle 100, the microcontroller 235 actuates the charging control switch 245 to electrically connect the energy reservoir 230 to the supply circuit 215 via the charging constant current regulator 240. During charging, the charging constant current regulator 240 regulates the charging current to maintain a constant current flow to the energy reservoir 230. As a consequence, the charging constant current regulator 240 prevents an in-rush of current to the energy reservoir 230. When the microcontroller 235 detects that the energy reservoir 230 reaches a predetermined voltage, the microcontroller 235 deactivates the charging constant current regulator 240. The control switching 245 is actuated to bypass the charging constant current regulator 240 to provide non-regulated current. The energy reservoir 230 is then directly connected to the supply circuit 215 for the remainder of the charging cycle.

Figure 4:
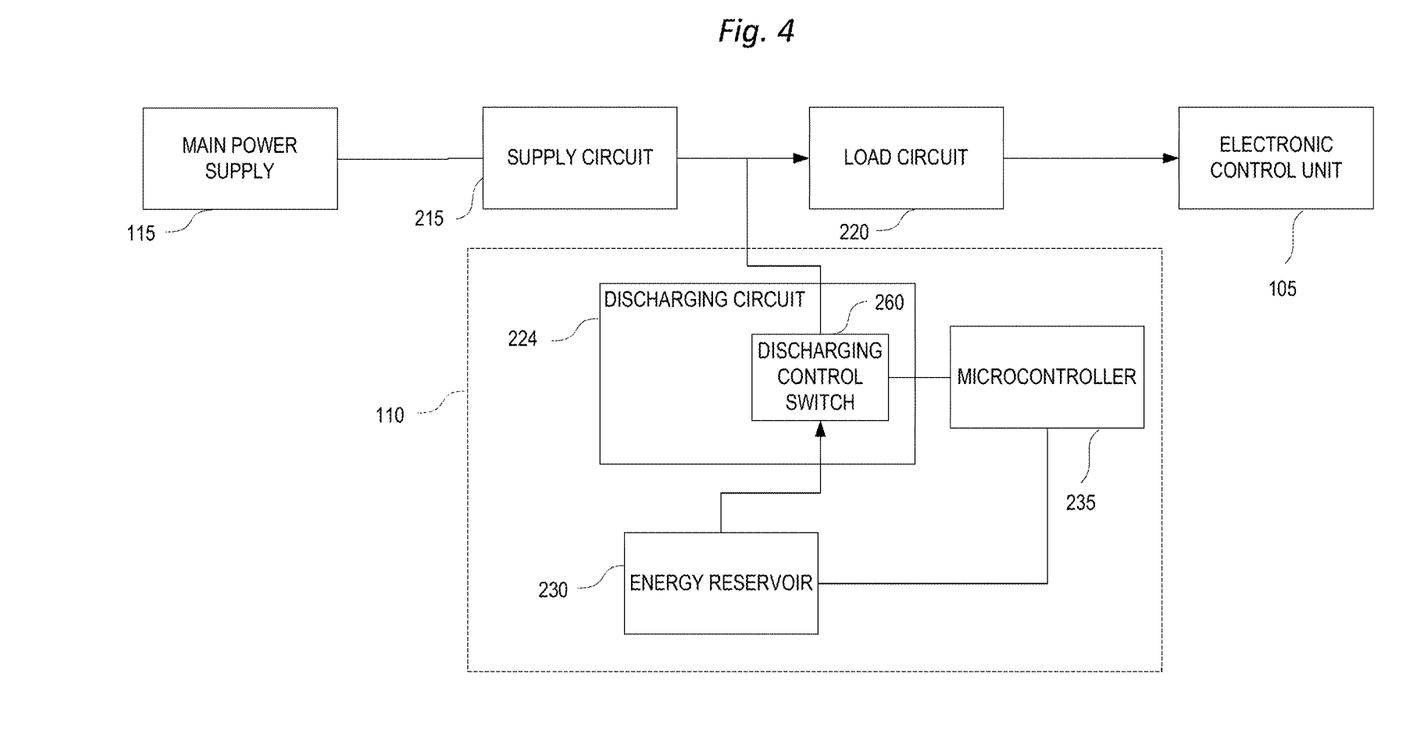
FIG. 4 is a block diagram illustrating discharging of the backup power system of FIG. 2 according to one embodiment.

FIG. 4 illustrates the backup power system 110 when the backup power system 110 is supplying power to the ECU 105. The arrows in FIG. 4 illustrate a current path for the backup power system 110 when the energy reservoir 230 is supplying current to the ECU 105. The backup power system 110 supplies power to the ECU 105 via the indicated current path when the microcontroller 235 detects a voltage below a predetermined threshold being supplied to the ECU 105. The microcontroller 235 may detect this voltage at the discharging circuit 224 or at various other locations internal or external to the backup power system 110.

In some embodiments, the supply circuit 215 includes a boost switched-mode power supply (boost SMPS) to increase a voltage supplied by the main power supply 115. The increased voltage is used to charge the energy reservoir 230 to a higher voltage than a voltage of the main power supply 115. As a consequence, the energy reservoir 230 holds a greater amount of charge than without the boost SMPS. In these embodiments, the load circuit 220 may include a buck switched-mode power supply (buck SMPS) to decrease the output voltage level supplied by the energy reservoir 230 to the ECU 105.

Figure 5:
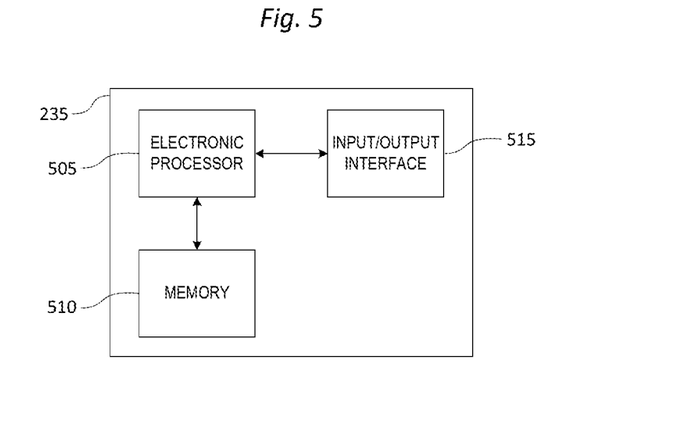
FIG. 5 is a block diagram of a microcontroller for the backup power system of FIG. 2 according to one embodiment.

FIG. 5 illustrates one construction of a microcontroller 235 for the backup power system 110 according to one embodiment. The microcontroller 235 includes a plurality of electrical and electronic components that provide power, operation control, and protection to the components and modules within the microcontroller 235. The microcontroller 235 includes an electronic processor 505 (e.g., a programmable electronic microprocessor or similar device), a memory 510 (e.g., non-transitory, machine-readable memory), and an input/output interface 515. The electronic processor 505 is communicatively coupled to the memory 510 and executes instructions stored on the memory 510. The electronic processor 505 is configured to retrieve from memory 510 and execute, among other things, instructions related to the control processes and method described herein. In other embodiments, the microcontroller 235 includes additional, fewer, or different components. It should be noted that, in some embodiments, parts of the microcontroller 235 may be integrated into an application specific integrated circuit (ASIC).

The input/output interface 515, which may include one or more ports and wired or wireless interfaces, receives and transmits data external to the microcontroller 235 including the charging circuit 222, the discharging circuit 224, the diagnostic circuit 225, the voltage detection circuit 227, or some combination thereof. The input/output interface 515 is configured to output a control signal to the charging circuit 222, the discharging circuit 224, and the diagnostic circuit 225. When the input/output interface 515 receives input from the voltage detection circuit 227 including values indicative of voltages, currents, and slew rates relating to the energy reservoir 230, the microcontroller 235 may store the received input in the memory 510. The microcontroller 235 may receive and store these inputs periodically based on predetermined settings within the microcontroller 235.

Figure 6:
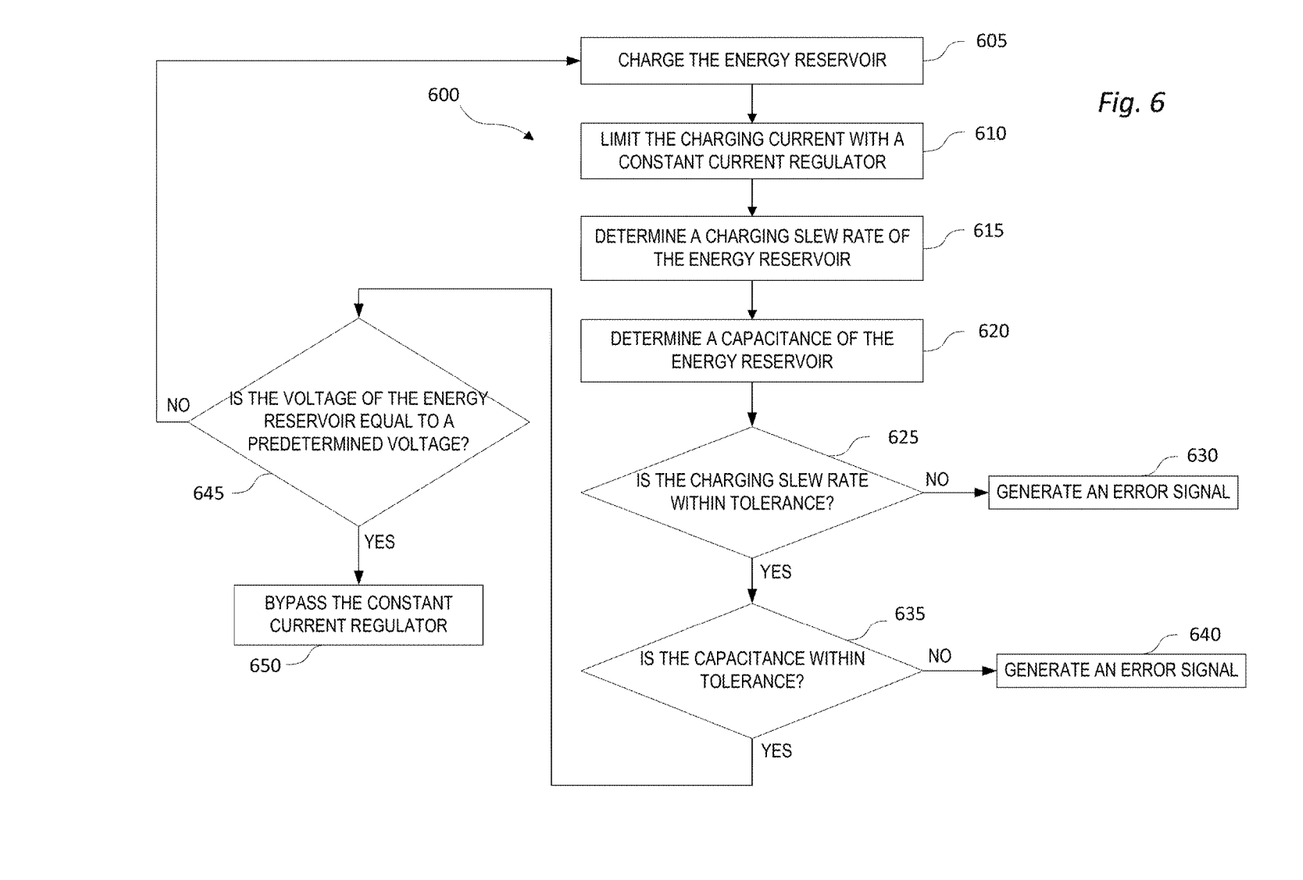
FIG. 6 is a flowchart of a method of performing diagnostics during charging of the backup power system of FIG. 2 according to one embodiment.

FIG. 6 illustrates an exemplary method 600 of diagnostic charging for the backup power system 110. On startup of the vehicle 100 or on detection of low voltage at the energy reservoir 230, the microcontroller 235 activates the charging circuit 222 to charge the energy reservoir 230 (step 605). Charging current flows from the supply circuit 215 to the energy reservoir 230 through the charging circuit 222 based on actuation of the charging control switch 245 by the microcontroller 235. During charging, the microcontroller 235 limits the charging current to a predetermined fixed current with the charging constant current regulator 240 (step 610). The microcontroller 235 detects the voltage change over time (e.g., from a direct electrical connection with the energy reservoir 230 or the voltage detection circuit 227) and determines the charging slew rate of the energy reservoir 230 based on a voltage change over time (step 615). The microcontroller 235 may also determine the capacitance of the energy reservoir 230 based on the rate of voltage change and the fixed charging current (step 620). The microcontroller 235 determines if the charging slew rate is within tolerance (step 625). When the charging slew rate is not within tolerance, the microcontroller 235 generates an error signal (step 630). When the charging slew rate is within tolerance, the microcontroller 235 determines if the capacitance of the energy reservoir 230 is within tolerance (step 635). When the capacitance of the energy reservoir 230 is not within tolerance, the microcontroller 235 generates an error message (step 640). The microcontroller 235 monitors the voltage of the energy reservoir 230 and determines if the voltage of the energy reservoir 230 is equal to a predetermined voltage (step 645). When the voltage of the energy reservoir 230 is equal to the predetermined voltage, the microcontroller 235 bypasses the charging constant current regulator 240 to allow faster charging of the energy reservoir 230 for the remaining charge cycle (step 650).

Figure 7:
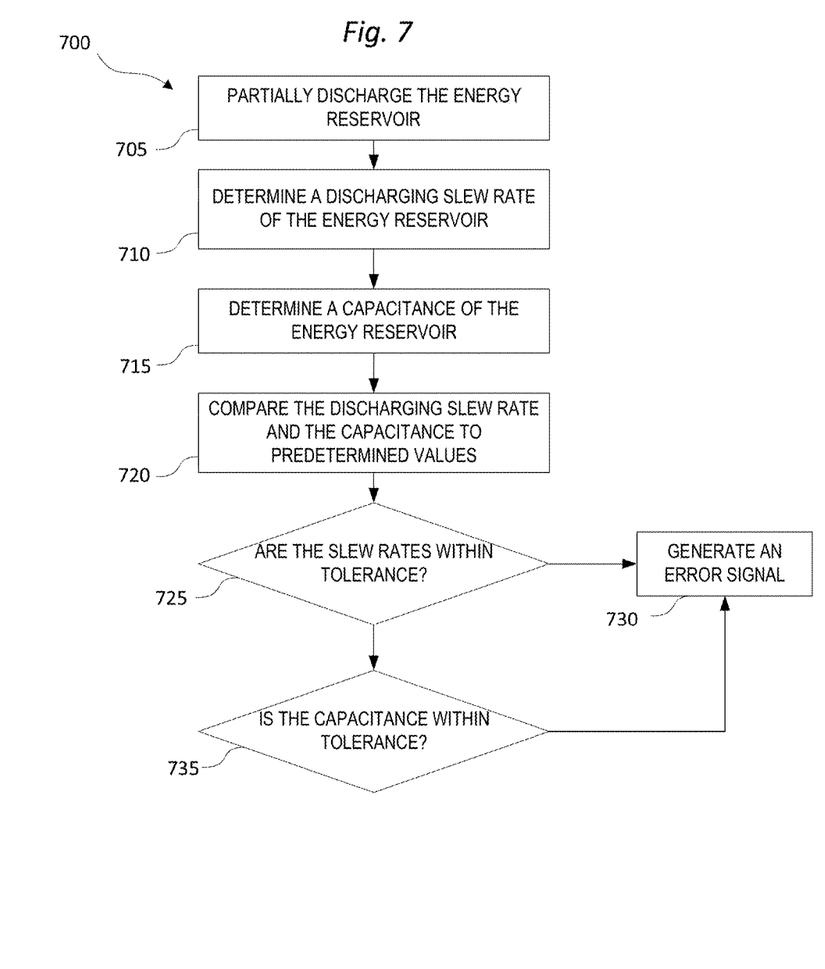
FIG. 7 is a flowchart of a method of performing diagnostics during operation of the backup power system of FIG. 2 according to one embodiment.

FIG. 7 illustrates an exemplary method 600 of diagnostic operation of the backup power system 110. The microcontroller 235 initiates discharging of the energy reservoir 230 (step 705). During discharging, the microcontroller 235 monitors and stores a plurality of voltage readings of the energy reservoir 230 in memory 510 (e.g., from a direct electrical connection with the energy reservoir 230 or the voltage detection circuit 227) in repeated measurements (e.g., at periodic intervals). The microcontroller 235 determines a discharging slew rate of the energy reservoir 230 based on the monitored voltage readings during the partial discharge (step 710). In some embodiments, the microcontroller 235 calculates a capacitance of the energy reservoir 230 based on the plurality of monitored voltage readings and the discharging slew rate (step 715). The microcontroller 235 compares the discharging slew rate to a predetermined value and the capacitance to another predetermined value (step 720). The microcontroller 235 determines whether the discharging slew rate is within tolerance as compared to the predetermined value (step 725). When the discharging slew rate is not within tolerance, the microcontroller 235 generates an error signal (step 730). The microcontroller 235 also determines whether the capacitance is within tolerance as compared to the another predetermined value (step 735). When the capacitance is not within tolerance, the microcontroller 235 generates an error signal (step 730). It should be noted that the error signal generated from the discharging slew rate and the error signal generated from the capacitance may be different signals and sent to different indicators.

In one example of the method 700, the microcontroller 235 at least partially discharges the energy reservoir 230 to ground through a resistive path. As a consequence, a small amount of charge is bled from the energy reservoir 230 through the resistive path. The microcontroller 235 may control this discharge diagnostic to occur continuously during operation of the backup power system 110 or upon periodic activation. In particular, the microcontroller 235 may run this diagnostic on a predetermined schedule, such as a periodic schedule or upon request by another vehicle system. During the continuous diagnostic, the microcontroller 235 monitors the voltage of the energy reservoir 230, the current based on a known resistance of the resistive path, and the discharging slew rate associated with the energy reservoir 230. The microcontroller 235 may compare the monitored values to stored values in memory 510. For example, the microcontroller 235 may reference a lookup table defining values within tolerance. As described above, the microcontroller 235 may calculate a capacitance of the energy reservoir 230 based on these monitored values and generate an error signal if the capacitance is outside of tolerance.

In another example of the method 700, the microcontroller 235 may at least partially discharge the energy reservoir 230 via the diagnostic constant current regulator 250 of the diagnostic circuit 225. In particular, the diagnostic constant current regulator 250 discharges a fixed amount of current/charge from the energy reservoir 230 to ground. As a consequence, the microcontroller 235 may determine the discharging slew rate via voltage measurements recorded at predetermined intervals of time and capacitance of the energy reservoir 230 based on the slew rate and the fixed amount of current/charge. As in the previous example, the microcontroller 235 may run this diagnostic continuously, on a predetermined schedule, or by request.

Figure 8:
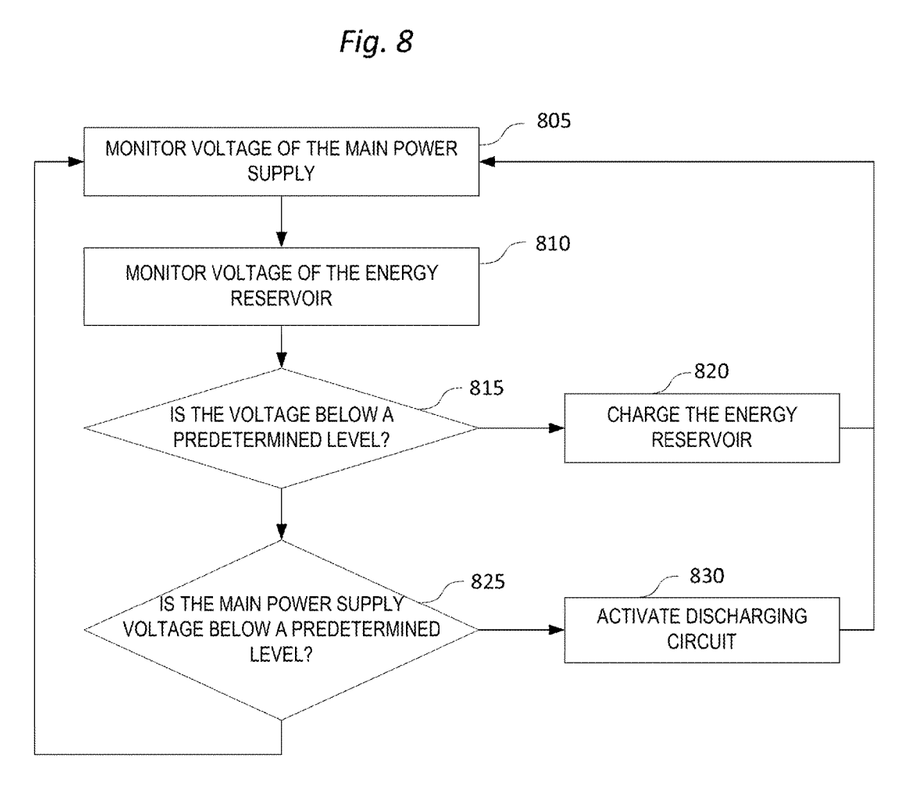
FIG. 8 is a flowchart of a method of operating the backup power system of FIG. 2 according to one embodiment.

FIG. 8 illustrates an exemplary method of operation of the backup power system 110. The microcontroller 235 continuously monitors the voltage of the main power supply 115 (step 805), which may be measured from the charging circuit 222, the discharging circuit 224, or an external reference voltage. The microcontroller 235 also continuously monitors the voltage of the energy reservoir 230 (step 810). The microcontroller 235 determines whether the voltage of the energy reservoir 230 is below a predetermined level (step 815). When the voltage of the energy reservoir 230 is below the predetermined level, the microcontroller 235 charges the energy reservoir 230 via the charging circuit 222 in accordance with the method 600 (step 820). The microcontroller 235 also determines whether the main power supply 115 is below another predetermined level (step 825). When the voltage of the main power supply 115 is below the another predetermined level, the microcontroller 235 activates the discharging circuit 224 to supply the ECU 105 with emergency power (step 830).

Thus, the invention provides, among other things, a backup power system for electronic control units of a vehicle and methods of performing diagnostics and operation of the backup power system. Various features and advantages of the invention are set forth in the following claims.

What is claimed is:

1. A backup power system in a vehicle that provides temporary power to at least one electronic control unit (ECU) upon failure of a main power supply, the backup power system comprising:
   an energy reservoir that stores electric charge;
   a charging circuit electrically connected to the energy reservoir;
   a discharging circuit electrically connected between the energy reservoir and the at least one electronic control unit;
   a diagnostic circuit electrically connected to the energy reservoir and configured to regulate a current flow for the energy reservoir;
   an electronic processor communicatively coupled to the diagnostic circuit, the electronic processor configured to
      monitor a change in a voltage over time of the energy reservoir as an amount of stored electric charge in the energy reservoir changes,
      determine if the change in a voltage over time is within a predetermined range, and when the change in a voltage over time is not within the predetermined range,
      generate a first error signal.

2. The backup power system of claim 1, wherein the energy reservoir includes one or more capacitors and wherein the at least one electronic control unit is an airbag electronic control unit.

3. The backup power system of claim 1, comprising: a constant current regulator included in the diagnostic circuit; a voltage detector that generates a voltage signal indicative of a voltage of the energy reservoir, the voltage detector electrically connected to the electronic processor; and a control switch actuated by the electronic processor, the control switch electrically connected between the constant current regulator and the energy reservoir.

4. The backup power system of claim 3, wherein the constant current regulator regulates a current flow by setting a fixed amount of a charging current being supplied to the energy reservoir, and wherein the electronic processor determines a charging change in a voltage over time based on the voltage signal.

5. The backup power system of claim 4, wherein the charging current flows from the charging circuit to the energy reservoir through the control switch based on actuation by the electronic processor.

6. The backup power system of claim 4, wherein the charging change in a voltage over time is determined during initial charging of the energy reservoir, and wherein, after initial charging, the constant current regulator is bypassed allowing higher current and higher voltage charging of the energy reservoir.

7. The backup power system of claim 3, wherein the constant current regulator regulates a current flow by setting a fixed amount of a discharge current during a discharge diagnostic cycle, and wherein the electronic processor determines a discharging change in a voltage over time based on the voltage signal.

8. The backup power system of claim 7, wherein the discharge current flows from the energy reservoir to ground through the control switch based on actuation by the electronic processor.

9. The backup power system of claim 8, wherein the voltage detector is a high-resistance voltage divider connected between a terminal on the energy reservoir and the electronic processor.

10. The backup power system of claim 1, comprising: a boost switched-mode power supply included in the charging circuit, the boost switched-mode power supply configured to increase an input voltage level supplied to the energy reservoir from a vehicle battery.

11. The backup power system of claim 1, comprising: a buck switched-mode power supply included in the discharging circuit, the buck switched-mode power supply configured to decrease an output voltage level supplied to the at least one electronic control unit from the energy reservoir.

12. A method of supplying temporary backup power to at least one electronic control unit in a vehicle upon failure of a main power supply, the method comprising:
   charging an energy reservoir via a charging circuit;
   storing an electric charge in the energy reservoir;
   discharging at least part of the electric charge in the energy reservoir to the at least one electronic control unit upon failure of the main power supply;
   regulating a current in a diagnostic circuit to maintain a constant current flow for the energy reservoir;
   monitoring, with an electronic processor, a change in a voltage over time of the energy reservoir during a change of the stored electric charge in the energy reservoir;
   determining, with the electronic processor, if the change in a voltage over time is within a predetermined range; and when the change in a voltage over time is not within the predetermined range,
   generate, with the electronic processor, a first error signal.

13. The method of claim 12, comprising: detecting a voltage of the energy reservoir with the electronic processor; and determining the change in a voltage over time based on the constant current flow and the voltage of the energy reservoir.

14. The method of claim 13, wherein the voltage is detected at predetermined intervals and wherein, the change in a voltage over time is determined at the predetermined intervals.

15. The method of claim 13, comprising: setting a fixed amount of charging current being supplied to the energy reservoir via a charging current regulator, and determining a charging change in a voltage over time based on the voltage and the constant current flow.

16. The method of claim 13, comprising actuating a control switch, via the electronic processor, to charge the energy reservoir with the constant current flow upon startup of the vehicle.

17. The method of claim 16, comprising actuating the control switch, via the electronic processor when the energy reservoir reaches a predetermined voltage, and when the energy reservoir reaches the predetermined voltage, bypassing a constant current regulator.

18. The method of claim 13, comprising: setting a fixed amount of discharge current via a discharging constant current regulator during a discharge diagnostic cycle, and determining, via the electronic processor, a discharging change in a voltage over time based on the voltage of the energy reservoir and the fixed amount of discharge current.

19. The method of claim 18, comprising actuating a control switch, via the electronic processor, to electrically connect the energy reservoir to ground through the discharging constant current regulator during the discharge diagnostic cycle.

20. The method of claim 12, wherein during failure of the main power supply, the energy reservoir supplies the at least one electronic control unit with power that enables the at least one electronic control unit to send critical messages from the at least one electronic control unit to other vehicle systems.

* * * * *